United States Patent [19]

Tipton

[11] Patent Number: 4,742,561

[45] Date of Patent: May 3, 1988

[54] APPARATUS FOR GENERATING SIGNALS USEFUL FOR TESTING THE SENSITIVITY OF MICROWAVE RECEIVING EQUIPMENT

[75] Inventor: M. Scott Tipton, St. James, N.Y.

[73] Assignee: Home Box Office, Inc., New York, N.Y.

[21] Appl. No.: 774,324

[22] Filed: Sep. 10, 1985

[51] Int. Cl.[4] .............................................. H04B 17/00
[52] U.S. Cl. ...................................... 455/67; 455/226; 324/57 N; 342/168
[58] Field of Search .......................... 455/226, 67, 63; 331/78; 324/57 N; 343/17.7; 342/168, 173

[56] References Cited

U.S. PATENT DOCUMENTS

| | | | |
|---|---|---|---|
| 3,731,186 | 5/1973 | Sadel | 324/57 N |
| 3,896,385 | 7/1975 | Chitre et al. | 455/226 |
| 4,004,230 | 1/1977 | Campbell | 325/363 |
| 4,023,104 | 5/1977 | Rheinfelder | 325/308 |
| 4,025,854 | 5/1977 | Oades | 325/67 |
| 4,048,567 | 9/1977 | Johnson et al. | 325/363 |
| 4,074,201 | 2/1978 | Lennon | 325/363 |
| 4,095,192 | 6/1978 | Atkinson et al. | 331/78 |
| 4,125,809 | 11/1978 | Mott | 455/67 |
| 4,328,552 | 5/1982 | Stovall | 342/168 |
| 4,353,031 | 10/1973 | Bock | 331/78 |

FOREIGN PATENT DOCUMENTS

| | | | |
|---|---|---|---|
| 1218564 | 6/1966 | Fed. Rep. of Germany | 342/168 |
| 2755221 | 6/1979 | Fed. Rep. of Germany | |
| 58-151734 | 9/1983 | Japan. | |

OTHER PUBLICATIONS

Beck, D. et al, "Fading Machine for the Simulation of the Ionosphere", 1965, pp. 74–79.
"Avalanche Diodes as Transfer Noise Standards," pp. 133–135, Keen, 1971.
"Measurement Parameters for Preventative Maintenance," Thomas, pp. 32–35, May 1977.

Primary Examiner—Robert L. Griffin
Assistant Examiner—Curtis Kuntz
Attorney, Agent, or Firm—Wayne M. Kennard

[57] ABSTRACT

The present invention is an apparatus for generating a signal for use in testing the purported sensitivity of a microwave receiving equipment having a noise source (105, 106) for generating a noise signal, first (112), second (114), and third (118) stage microamplifiers connected in series with an attenuator (116) for amplification and adjustment of the power level of the noise signal, a first splitter (120) connected to the output of the third stage amplifier (118), a first power meter (124) connected to a first output of the first splitter (120), a second splitter (130) receiving at its input a microwave carrier signal (127) having a specific power level, a second power meter (134) connected to a first output of the second splitter (132) and a combiner (138) connected to the second outputs of the first and second splitters (120, 130) which provides an output test signal for use in testing the carrier to noise of the microwave receiving equipment.

21 Claims, 2 Drawing Sheets

# APPARATUS FOR GENERATING SIGNALS USEFUL FOR TESTING THE SENSITIVITY OF MICROWAVE RECEIVING EQUIPMENT

TECHNICAL FIELD

The present invention relates to apparatuses which generate signals useful for testing the sensitivity of microwave receiving equipment. More specifically, the present invention relates to an apparatus which generates output test signal useful for testing the sensitivity of microwave receiving equipment in which there is a predetermined separation between the power level of a noise signal and the power level of a carrier signal which are combined to form the output test signal.

BACKGROUND ART

Present day microwave receiving systems can be configured such that a single microwave antenna is connected to microwave receiving equipment. The signals received by the dedicated antenna which are input to the microwave receiving equipment usually have a noise component which accompanies the microwave signal. The microwave receiving equipment for any system of this type is generally chosen according to its sensitivity and the expectant signal to noise ratio of the incoming signal. That is, the microwave receiving equipment must have the proper signal to noise sensitivity to be able to distinguish between the microwave signal and noise component of the received signal. If the microwave receiving equipment has a sensitivity below the threshold signal to noise ratio of the incoming signal, the microwave receiving equipment can distinguish between the microwave signal and noise thereby allowing for signal capture. If, however, the sensitivity of the microwave receiving equipment is above the threshold signal to noise ratio of the incoming signal, there will not be signal capture resulting in noise being output from the microwave receiving equipment.

The prior art discloses systems or devices to test or diagnose certain receiver characteristics but none are useful for testing the purported sensitivity of microwave receiving equipment.

U.S. Pat. No. 4,004,230 discloses a device for evaluating receiver parameters such as sensitivity, bandpass characteristics and operating frequencies by injecting a modulated signal into the receiver under test. U.S. Pat. No. 4,125,809 discloses a system to measure the ratio of carrier power to noise power in a 1 Hz bandwidth of an earth coverage beacon signal. Japanese application No. 58-151734 discloses a receiver having a self-diagnosing means which has incorporated therein a noise generator which delivers a self-diagnosing signal to the receiver. However, these systems or devices, as stated, do not provide a test signal with a fixed separation between carrier and noise power levels which is injected into the microwave receiving equipment under test to test the purported sensitivity of the microwave receiving equipment as does the present invention.

DISCLOSURE OF THE INVENTION

The present invention is an apparatus which generates an output test signal useful for testing the sensitivity of microwave receiving equipment. The test signal output from the apparatus of the invention is a combined signal formed from a noise signal and a carrier signal. The output test signal has a predetermined separation between the power level of a noise signal and the power level of a carrier signal that can be varied which when injected into microwave receiving equipment will allow the signal or carrier to noise sensitivity of the microwave receiving equipment under test to be measured.

The apparatus of the present invention has two noise sources for generating the noise signal portion of the output test signal. The first noise source is a naturally excited resistor and the second noise source is a diode energized by a variable voltage source. The first noise source, the naturally excited resistor, is selected when a passive device is desired. The second noise source, the diode, is selected when it is desired to generate an output test signal with a greater power level for testing the sensitivity of microwave receiving equipment. Both noise sources are connected to a switch which can be positioned to select either noise source dependent on whether the apparatus is to be tested by passive or active tests signals.

The output of the switch is connected to the input a first amplifier stage. This amplifier stage amplifies the power level of the noise signal generated by, for example, the diode noise source. The output of the first amplifier stage is connected to the input of a second amplifier stage which like the first amplifier stage amplifies the power level of noise signal. The output of the second amplifier stage is input to an attenuator. The attenuator is used to attenuate the power level of the noise signal to a predetermined value as will be described.

The output of the attenuator is input to a third amplifier stage which amplifies the power level of the noise signal output from the attenuator. The output of the third stage amplifier is input to a first splitter.

The noise signal is split into two signals by the first splitter. The first signal output from the first splitter is input to a power meter for viewing the power level of the signal received. The second signal output from the first splitter is input to a combiner.

The attenuation of the power level of the noise signal to the desired predetermined value can be viewed by observing the power meter connected to the output of the first splitter previously mentioned. When the desired power level of the noise signal is reached, the attenuation operation is stopped.

A second splitter receives at its input a carrier signal which forms the second portion of the output test signal of the apparatus of the invention. The first signal of the split carrier signal output from the second splitter is input to a power meter for viewing the power level of the carrier signal to determine the exact power level of the carrier signal. The second signal of the split carrier signal output from the second splitter is input to the combiner which also receives at another input the second output of the first splitter. The combiner combines the noise signal and carrier signal to provide an output test signal with a specific separation between the power levels of the carrier signal and noise signal to be injected into the microwave receiving equipment so that the carrier to noise of the microwave receiving equipment under test can be measured.

An object of the invention is to provide an apparatus for generating an output test signal useful for testing the carrier to noise and ultimately the signal to noise sensitivity of microwave receiving equipment.

Another object of the invention is to provide an apparatus for generating an output test signal useful for testing the sensitivity of a microwave receiving equipment in which the output test signal has a predetermined separation between the power level of the noise signal and the power level of the carrier signal indicative of the signal to noise sensitivity of the microwave receiving equipment under test.

These and other objects of the invention will be described more fully in the remaining portions of the disclosure.

A BRIEF DESCRIPTION OF THE DRAWING

DETAILED DESCRIPTION OF THE INVENTION

Figure 1:
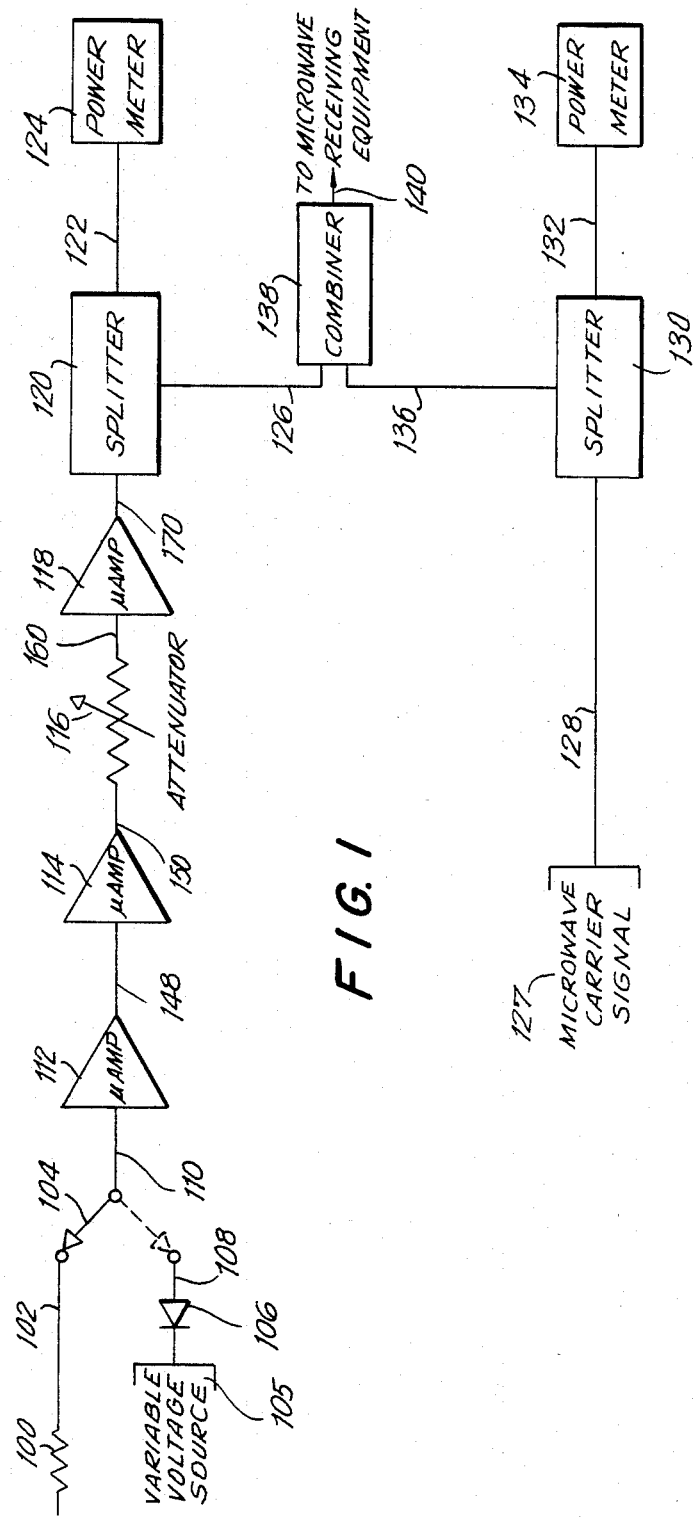
FIG. 1 shows a schematic diagram of the apparatus of the invention.

Referring to FIG. 1, a schematic diagram of the apparatus of the present invention is shown. The apparatus of the present invention is independent of the microwave receiving equipment under test. The apparatus of the invention generates an output test signal having a fixed separation between the power level of a noise signal and the power level of the carrier signal which are combined to form the output test signal.

The combined signal output from the apparatus of the invention has a specific signal to noise ratio consistent with the purported signal to noise sensitivity of the microwave receiving equipment being tested. When such a test signal is injected into microwave receiving equipment and signal capture is achieved, the microwave receiving equipment has a signal to noise sensitivity consistent with the separation between the power levels of the carrier signal and noise signal of the output test signal from the apparatus of the invention. If, on the other hand, there is no signal capture, the microwave receiving equipment does not have this purported sensitivity.

Again referring to FIG. 1, there are two noise sources for generating a noise signal in the apparatus of the invention. The first is naturally excited resistor 100 and the second is diode 106 energized by variable voltage source 105. Which noise source is selected is determined by switch 104 that can be positioned to select either line 102 connected to naturally excited resister 100 or to line 108 connected to diode noise source 106.

Noise source 100 is selected when it is desired to generate an output test signal from a passive noise source. Resistor 100 is a resistor of the same AC resistance as the input AC resistance of the first stage amplifier. That is, there is impedance matching between the resistor 100 and the stage amplifier. At room temperature, when excited, resistor 100 produces random noise with a power level in the range of −65 to −70 dB.

When it is desired to produce an output test signal with a power level of greater amplitude for testing the sensitivity of microwave receiving equipment, switch 104 is positioned to select line 108 connected to diode 106.

Variable voltage source 105 which is connected to and energizes diode 106 is a DC source. Variable voltage source 105 is variable between 0 and −20 volts. The voltage used to energize diode 106 within the above stated range is determined by selection of the voltage which produces a noise signal with the greatest power level. This voltage is approximately −10 volts ±0.

Diode 106 is forward biased in line 108 toward variable voltage source 105. When diode 106 is energized, it generates a noise signal on line 108 between diode 106 and the terminal of switch 104 connected to line 108. The noise signal generated on line 108 by diode 106 has a power level of approximately −60 dB. Diode 106 is commercially available from Hewlett Packard, Palo Alto, Calif., and has Model No. HP-346B.

Taking for example a noise signal generated by the diode 106, the noise signal on line 108 having a power level of approximately −60 dB is input to line 110 through switch 104. The noise signal on line 110 having a power level of approximately −60 dB is input to first stage microamplifier 112. Microamplifier 112 is a gain block amplifier commercially available from Avantek Inc., Santa Clara, Calif., and has Model No. ALD-4201N.

First stage microamplifier 112 amplifies the power level from approximately −60 dB to approximately −40 dB. The output of first stage microamplifier 112 on line 148 is input to second stage microamplifier 114. Second stage microamplifier 114 has the same Model No. and manufacturer as first stage microamplifier 112. Second stage microamplifier 114 amplifies the power level of the noise signal from approximately −40 dB to approximately −20 dB. The output of second stage microamplifier 114 on line 150 is input to attenuator 116. The operation of attenuator 116 will be described subsequent to the description of third stage microamplifier 118.

The output of attenuator 116 on line 160 is input to a third stage microamplifier 118. Third stage microamplifier 118 has the same Model No. and manufacturer as the other two microamplifiers previously described. Third stage microamplifier 118 amplifies the output of attenuator 116 from approximately −20 dB to a power level of approximately 0 dBm. The noise signal with a power level of approximately 0 dBm on line 170 is input to splitter/combiner 120 configured as a splitter.

Attenuator 116 which is disposed between second stage microamplifier 114 and third stage microamplifier 118 is used for attenuation of the power level of the amplified noise signal so that the power level of the noise signal output from third stage microamplifier 118 on line 170 has a value of 0 dBm.

Attenuator 116 has an adjustment range of approximately 3 dB. Within this 3 dB range, attenuator 116 is accurate to 0.01 dB. Attenuator 116 can be of any suitable commercially available type, for example, Model No. 4684-100 from Arra, Inc., Bayshore, N.Y. Although attenuator 116 is shown disposed between second stage amplifier 114 and third stages amplifier 118, it can be disposed before all of the amplifier stages, after all of the amplifier stages or between any two amplifier stages without affecting operation of the apparatus of the invention.

Figure 2:
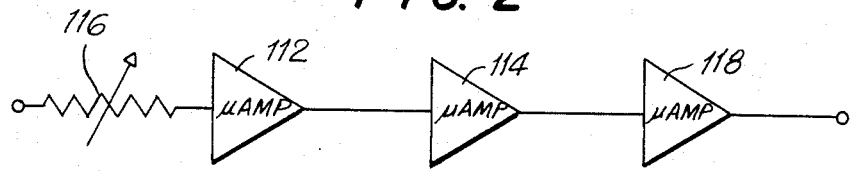
FIG. 2 shows a first alternative dispositon of the attenuator with respect to the amplifier stages.
Figure 3:
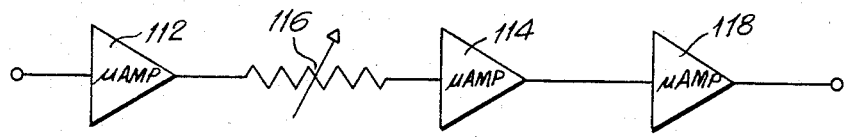
FIG. 3 shows a second alternative disposition of the attenuator with respect to the amplifier stages.
Figure 4:
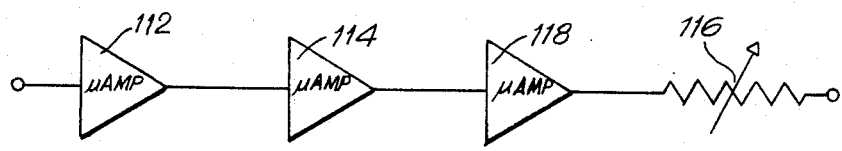
FIG. 4 shows a third alternative disposition of the attenuator with respect to the amplifier stages.

FIGS. 2, 3 and 4 show the alternative dispositions of attenuator 116 with respect to first amplifier stage 112, second amplifier stage 114, and third amplifier stage 118. FIG. 2 shows attenuator 116 disposed before first amplifier stage 112; FIG. 3 shows attenuator 116 disposed between first amplifier stage 112 and second amplifier stage 114; and FIG. 4 shows attenuator 116 disposed after third amplifier stage 118.

Splitter 120 which receives the amplified noise signal on line 170 having a power level of 0 dBm splits it into two signals. After the split, a first noise signal is input to power meter 124 and a second noise signal is input to splitter/combiner 138 configured as a combiner. Each output from splitter 120 experiences a calculatable power loss due to splitting of the signal.

Power meter 124 is viewed to insure that the power level of the first noise signal output from splitter 120 on line 122 has a desired level. Since this signal has the desired power level, the operator knows that the output of third stage microamplifier 118 has a value of 0 dBm because he knows what the power loss was to the signal due to splitting. Likewise, the operator knows the power level of the second noise signal output from splitter 120 on line 126 since this power level is the same as the power level of the first noise signal input to power meter 124 which is monitored. Splitter/combiner 120 is commercially available from Narda Microwave Corporation, Hauppauge, New York, and has Model No. 3324-2.

In the preferred embodiment, the three microamplifiers 112, 114 and 118 are bandwidth amplifiers having an operational range in the C band (3.7 to 4.2 GHz). Therefore, besides amplifying the signals, they act as bandpass filters so that only noise within the 3.7 to 4.2 GHz range will passed through the amplifiers.

Microwave carrier signal 127 is input to line 128 to the apparatus of the invention. The carrier signal is usually produced by a separate generator which is plugged into the apparatus of the invention to provide the desired carrier signal.

Microwave carrier signal 127 on line 128 is input to combiner/splitter 130 configured as a splitter. Splitter/combiner 130 has the same Model No. and manufacturer as splitter/combiner 120. The carrier signal will be in the C band and compatable with the noise signal generated in the previously described portion of the apparatus of the invention. The power level of the carrier signal is such that it would comport with the purported signal to noise sensitivity of the microwave receiving equipment under test.

The carrier signal having this specific power level is split by splitter 130 with a first carrier signal being input to power meter 134 on line 132 and the second carrier signal being input to combiner 138 on line 136. Since the signal is split, each signal output from splitter 130 experiences a calculatable power level loss. This means that each of the outputs of splitter 130 has a known power level drop. This value is monitored by viewing a power meter 134.

The two signals, namely, the second noise signal from splitter 120 on line 126 having a known power level and the second carrier signal output from splitter 130 on 136 also having known a power level, are input to combiner 138 which combines these signals. Since the power level of the second noise signal is known and the power level of the second carrier signal is also known, there is an absolute difference between the power levels of the noise signal and the carrier signal which is meant to comport with the purported signal to noise sensitivity of the microwave receiving equipment under test. The combined signal output from combiner 138 on line 140 is input to the microwave receiving equipment being tested to determine if the purported carrier to noise and thence signal to noise sensitivity of the microwave receiving equipment is accurate.

Although the present invention has been described for use in the C band with a specific separation between the power level of the noise signal and the power level of the carrier signal, it is contemplated that different separations between the carrier signal and noise signal power levels can be achieved by the present invention, and the apparatus of the present invention can be configured to operate in other than the C band.

The terms and expressions which are employed here are used as terms of description and not of limitation, and there is no intention, in the use of such terms and expressions, of excluding the equivalents of the features shown and described, or portions thereof, it being recognized that various modifications are possible within the scope of the invention as claimed.

I claim:

1. An apparatus for generating a test signal for evaluating the sensitivity of receiving equipment comprising:
   a noise source for generating a first noise signal having undetermined power level;
   amplifier means for amplification of the power level of said noise signal and an attenuator means, for adjustment of the power level of said noise signal to a predetermined power level, connected in series between the noise source and a first splitter means;
   the first splitter means connected to the output of the series connected amplifier means and attenuator means for splitting said first noise signal into second and third noise signals;
   first power level monitoring means connected to the output of said first splitter means having said second noise signal output therefrom for monitoring the power level of said second noise signal;
   input means for receiving a first carrier signal having a predetermined power level;
   second splitter means connected to said input means for splitting said first carrier signal into second and third carrier signals;
   second power level monitoring means connected to the output of said second splitter means having said second carrier signal output therefrom for monitoring the power level of said second carrier signal; and
   combiner means connected to the outputs of said first and second splitter means having said third noise signal and said third carrier signal output therefrom, respectively, for combining these signals and outputting a combined signal indicative of said third noise signal and said third carrier signal.

2. The apparatus as recited in claim 1, wherein said noise source includes a diode.

3. The apparatus as recited in claim 2, wherein said diode is energized by a variable voltage source.

4. The apparatus as recited in claim 3, wherein the variable voltage source is varied to a voltage which energizes said diode to generate a first noise signal with a maximum power level output.

5. The apparatus as recited in claim 4, wherein the variable voltage source varies between 0 to −20 volts DC.

6. The apparatus as recited in claim 1, wherein said noise source further comprises a first noise source and a second noise source.

7. The apparatus as recited in claim 6, wherein a switch means is connected between said first noise source and said second noise source, and the amplifier means and attenuator means connected in series, with the switch means being capable of switching between a first terminal with means connected to said first noise source and a second terminal with means connected to said second noise source.

8. The apparatus as recited in claim 6, wherein said first noise source includes a diode.

9. The apparatus as recited in claim 8, wherein said diode is energized by a variable voltage source.

10. The apparatus as recited in claim 1, wherein the variable voltage source is varied to a voltage which energizes said diode to generate a first noise signal with a maximum power level output.

11. The apparatus as recited in claim 10, wherein the variable voltage source varies between 0 to −20 volts DC.

12. The apparatus as recited in claim 6, wherein said second noise source includes a naturally excited resistor for producing a second noise signal with a power level less than the power level of said first noise source.

13. The apparatus as recited in claim 12, wherein said second noise source includes a resistor which is matched to the input impedance of the amplifier means.

14. The apparatus as recited in claim 1, wherein said amplifier means further comprises first, second and third stage amplifiers connected in series.

15. The apparatus as recited in claim 14, wherein said first, second and third stage amplifiers include microamplifiers.

16. The apparatus as recited in claim 14, wherein said attenuator means is connected in series with said first, second and third stage amplifiers between the noise source and the first splitter means, whereby the output of the noise source is connected to the input of the attenuator means, the output of the attenuator means is connected to the input of the first amplifier the output of the first stage amplifier is connected to the input of the second stage amplifier, the output of the second stage amplifier is connected to the input of the third stage amplifier, and the output of the third stage amplifier is connected to the input of the first splitter means.

17. The apparatus as recited in claim 1, wherein said attenuator makes fine adjustments in the power level of said noise signal input to said first splitter.

18. The apparatus as recited in claim 1, wherein the combined signal output from said combiner means has a substantially fixed separation between the power level of the carrier signal and the power level of the noise signal.

19. The apparatus as recited in claim 14, wherein the attenuator means is connected in series with the first, second and third stage amplifiers between the noise source and the first splitter means, whereby the output of the noise source is connected to the input of the first stage amplifier, the output of the first stage amplifier is connected to the input of the attenuator means, the output of the attenuator means in connected to the input of the second stage amplifier, the output of the second stage amplifier is connected to the input of the third stage amplifier, and the output of the third stage amplifier is connected to the input of the first splitter means.

20. The apparatus as recited in claim 14, wherein the attenuator means is connected in series with the first, second and third stage amplifiers between the noise source and the first splitter means, whereby the output of the noise source is connected to the input of the first stage amplifier, the output of the first stage amplifier is connected to the input of the second stage amplifier, the output of the second stage amplifier is connected to the input of the attenuator means, the output of the attenuator means is connected to the input of the third stage amplifier, and the output of the third stage amplifier is connected to the input of the first splitter means.

21. The apparatus as recited in claim 14, wherein the attenuator means is connected in series with the first, second and third stage amplifiers between the noise source and the first splitter means, whereby the output of the noise source is connected to the input of the first stage amplifier, the output of the first stage amplifier is connected to the input of the second stage amplifier, the output of the second stage amplifier is connected to the input of the third stage amplifier, the output of the third stage amplifier is connected to the input of the attenuator means, and the output of the attenuator is connected to the input of the first splitter means.

* * * * *